United States Patent
Cho et al.

(10) Patent No.: US 8,570,887 B2
(45) Date of Patent: Oct. 29, 2013

(54) ANALOG BIAS CONTROL FOR PACKET COMMUNICATION SYSTEMS

(75) Inventors: Thomas B. Cho, Fremont, CA (US); Li Lin, Saratoga, CA (US); Mao Yu, San Jose, CA (US); Atul Salhotra, Sunnyvale, CA (US)

(73) Assignee: Marvell World Trade Ltd., St. Michael (BB)

( * ) Notice: Subject to any disclaimer, the term of this patent is extended or adjusted under 35 U.S.C. 154(b) by 401 days.

(21) Appl. No.: 12/944,031

(22) Filed: Nov. 11, 2010

(65) Prior Publication Data
US 2011/0116399 A1     May 19, 2011

Related U.S. Application Data

(60) Provisional application No. 61/262,874, filed on Nov. 19, 2009.

(51) Int. Cl.
*G01R 31/08*     (2006.01)
(52) U.S. Cl.
USPC ......................................... 370/252; 455/208

(58) Field of Classification Search
USPC ........................................... 370/252; 455/208
See application file for complete search history.

(56) References Cited

U.S. PATENT DOCUMENTS

| | | | |
|---|---|---|---|
| 2006/0193410 A1 | 8/2006 | Moorti et al. | |
| 2007/0172000 A1* | 7/2007 | Hamamoto et al. | 375/324 |
| 2007/0223626 A1* | 9/2007 | Waxman | 375/316 |
| 2008/0070534 A1 | 3/2008 | Lai | |
| 2008/0130799 A1 | 6/2008 | Yousef et al. | |
| 2010/0177655 A1* | 7/2010 | Duenyas | 370/252 |
| 2011/0053537 A1* | 3/2011 | Nagaraj et al. | 455/208 |

OTHER PUBLICATIONS

International Search Report and Written Opinion in corresponding PCT application No. PCT/US2010/057190 dated Apr. 27, 2011.

* cited by examiner

*Primary Examiner* — Sai-Ming Chan

(57) ABSTRACT

Apparatus having corresponding methods and non-transitory computer-readable media comprise an amplifier configured to amplify signals according to a bias current, wherein the signals represent packets of data; a packet module configured to recover the packets of data from the signals amplified by the amplifier; and a control module configured to control the bias current according to one or more characteristics of the packets of data.

18 Claims, 3 Drawing Sheets

ANALOG BIAS CONTROL FOR PACKET COMMUNICATION SYSTEMS

CROSS-REFERENCE TO RELATED APPLICATIONS

This disclosure claims the benefit of U.S. Provisional Patent Application Ser. No. 61/262,874, entitled "Preamble-based Analog Bias Control for Packet Based System," filed Nov. 19, 2009, the disclosure thereof incorporated by reference herein in its entirety.

FIELD

The present disclosure relates generally to packet data communication systems. More particularly, the present disclosure relates to control of the bias levels in the analog front ends of such systems.

BACKGROUND

In packet communication systems, packets of data are frequently transmitted between communication devices as analog signals. For example, a transmitting communication device modulates an analog carrier signal with the digital data prior to transmission over a communications channel, and a receiving communication device demodulates the analog signal to recover the digital data. In such systems, each communication device requires an analog front end to modulate, demodulate, and amplify the analog signals. The analog front end requires a certain bias current to function properly.

SUMMARY

In general, in one aspect, an embodiment features an apparatus comprising: an amplifier configured to amplify signals according to a bias current, wherein the signals represent packets of data; a packet module configured to recover the packets of data from the signals amplified by the amplifier; and a control module configured to control the bias current according to one or more characteristics of the packets of data.

Embodiments of the apparatus can include one or more of the following features. Some embodiments comprise at least one of: an SNR module to determine a signal-to-noise ratio (SNR) of one or more of the packets; an RSSI module to determine a received signal strength indication (RSSI) of one or more of the packets; and a modulation type module to determine a modulation type of one or more of the packets; wherein the control module controls the bias current according to at least one of the SNR, the RSSI, and the modulation type. In some embodiments, each of the packets includes a preamble; and the SNR, the RSSI, and the modulation type are determined based on the preambles of the one or more packets. In some embodiments, the control module controls the bias current for amplifying a payload of each packet based on the preamble of the packet.

In general, in one aspect, an embodiment features a method comprising: amplifying signals according to a bias current, wherein the signals represent packets of data; recovering the packets of data from the amplified signals after the amplifying; and controlling the bias current according to one or more characteristics of the packets of data.

Embodiments of the method can include one or more of the following features. Some embodiments comprise at least one of: determining a signal-to-noise ratio (SNR) of one or more of the packets; determining a received signal strength indication (RSSI) of one or more of the packets; and determining a modulation type of one or more of the packets; wherein the bias current is controlled according to at least one of the SNR, the RSSI, and the modulation type. In some embodiments, each of the packets includes a preamble; and the SNR, the RSSI, and the modulation type are determined based on the preambles of the one or more packets. In some embodiments, the bias current for amplifying a payload of each packet is controlled based on the preamble of the packet.

In general, in one aspect, an embodiment features non-transitory computer-readable media embodying instructions executable by a computer to perform a method comprising: controlling a bias current according to one or more characteristics of packets of data, wherein the packets of data are recovered from signals, and wherein the signals are amplified according to the bias current.

Embodiments of the non-transitory computer-readable media can include one or more of the following features. In some embodiments, the method further comprises: determining a signal-to-noise ratio (SNR) of one or more of the packets; determining a received signal strength indication (RSSI) of one or more of the packets; and determining a modulation type of one or more of the packets; wherein the bias current is controlled according to at least one of the SNR, the RSSI, and the modulation type. In some embodiments, each of the packets includes a preamble; and the SNR, the RSSI, and the modulation type are determined based on the preambles of the one or more packets. In some embodiments, the bias current for amplifying a payload of each packet is controlled based on the preamble of the packet.

The details of one or more implementations are set forth in the accompanying drawings and the description below. Other features will be apparent from the description and drawings, and from the claims.

Figure 1:
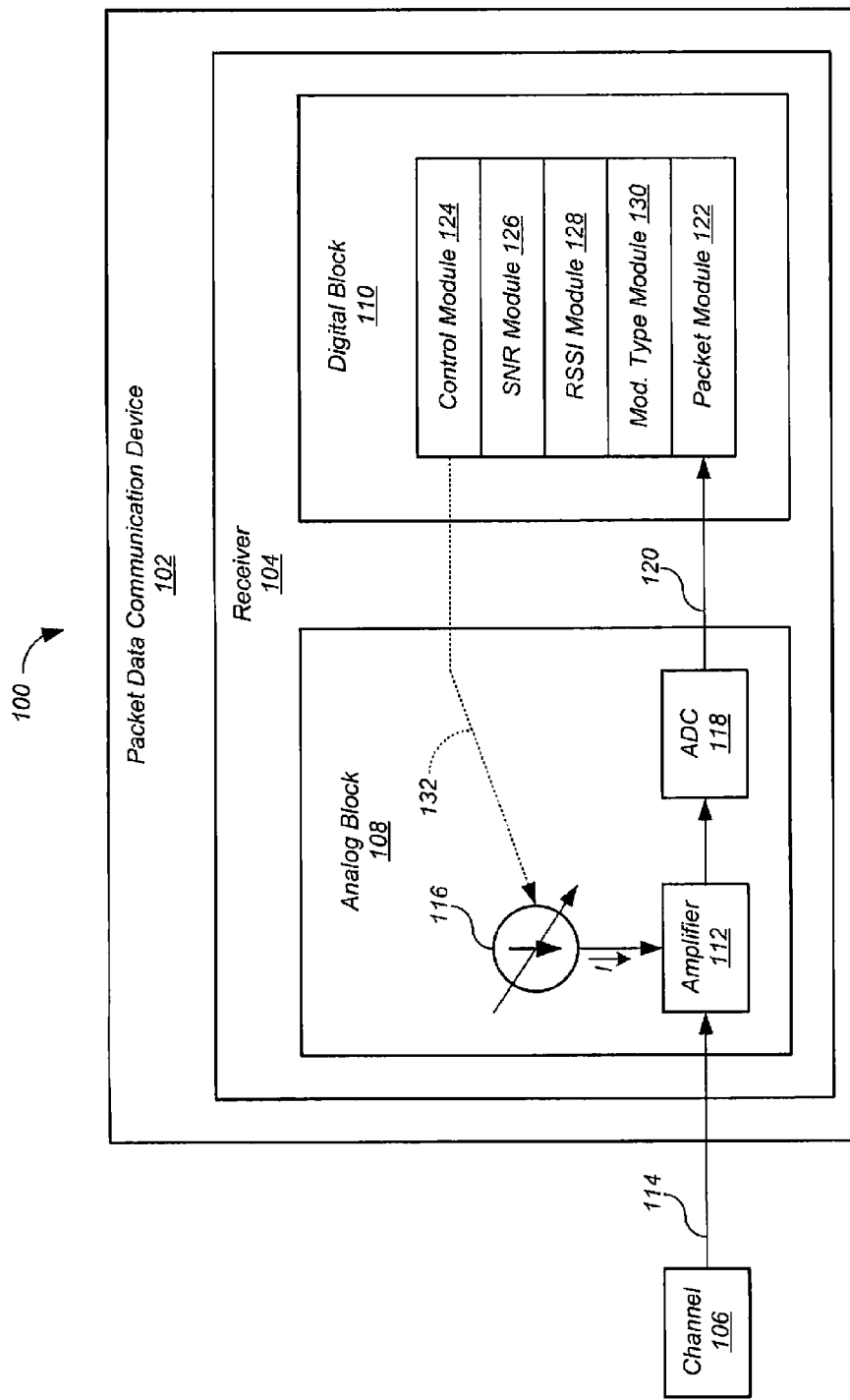
FIG. 1 shows elements of a packet data communication system according to one embodiment.

The leading digit(s) of each reference numeral used in this specification indicates the number of the drawing in which the reference numeral first appears.

DETAILED DESCRIPTION

Embodiments of the present disclosure provide analog bias control for packet-based systems. According to the disclosed embodiments, the bias current for the analog front end of a receiver is controlled according to the packets of data received. An amplifier in the analog front end amplifies received signals according to the bias current. The signals represent the packets of data. A packet module recovers the packets of data from the signals amplified by the amplifier. A control module controls the bias current according to the characteristics of the packets of data. For example, the control module can control the bias current according to the signal-to-noise ratio (SNR) of the packets, the received signal strength indication (RSSI) of the packets, the modulation type of the packets, and the like. The SNR, the RSSI, and the modulation type can be determined based on the preambles of the packets. The control module can control the bias current for amplifying a payload of each packet based on the preamble of that packet.

FIG. 1 shows elements of a packet data communication system 100 according to one embodiment. Although in the described embodiments the elements of packet data communication system 100 are presented in one arrangement, other embodiments may feature other arrangements. For example, elements of packet data communication system 100 can be implemented in hardware, software, or combinations thereof.

Referring to FIG. 1, packet data communication system 100 includes a packet data communication device 102 receiving signals 114 over a channel 106. Signals 114 represent packets of data. Channel 106 can be wired or wireless, and can be a network, a direct link, or the like. Packet data communication device 102 can be any sort of packet communication device, such as a computer, a personal digital assistant, a smartphone, and the like. In wireless systems, communication device 102 and signals 114 can be compliant with all or part of IEEE standard 802.11, including draft and approved amendments 802.11a, 802.11b, 802.11e, 802.11g, 802.11i, 802.11k, 802.11n, 802.11v, and 802.11w, although this is not required.

Packet data communication device 102 includes a receiver 104 that includes an analog block 108 containing analog circuits and a digital block 110 containing digital circuits. Analog block 108 includes an amplifier 112 that amplifies signals 114 received over channel 106 according to a bias current I. In FIG. 1, bias current I is provided by an adjustable current source 116. However, other implementations are contemplated, as discussed below. Analog block 108 also includes an analog-to-digital converter (ADC) 118 to provide digital data 120 to digital block 110 based on amplified analog signals 114.

Digital block 110 includes a packet module 122 to recover the packets of data from digital data 120, and a control module 124 to control bias current I according to characteristics of the packets of data. Digital block 110 also includes one or more of an SNR module 126 to determine signal-to-noise ratios (SNR) of the packets, an RSSI module 128 to determine a received signal strength indication (RSSI) of the packets, and a modulation type module 130 to determine a modulation type of the packets. Control module 124 controls bias current I according to one or more of the SNR, the RSSI, the modulation type, and the like. In some embodiments, digital block 110 is implemented as a digital signal processor.

Figure 2:
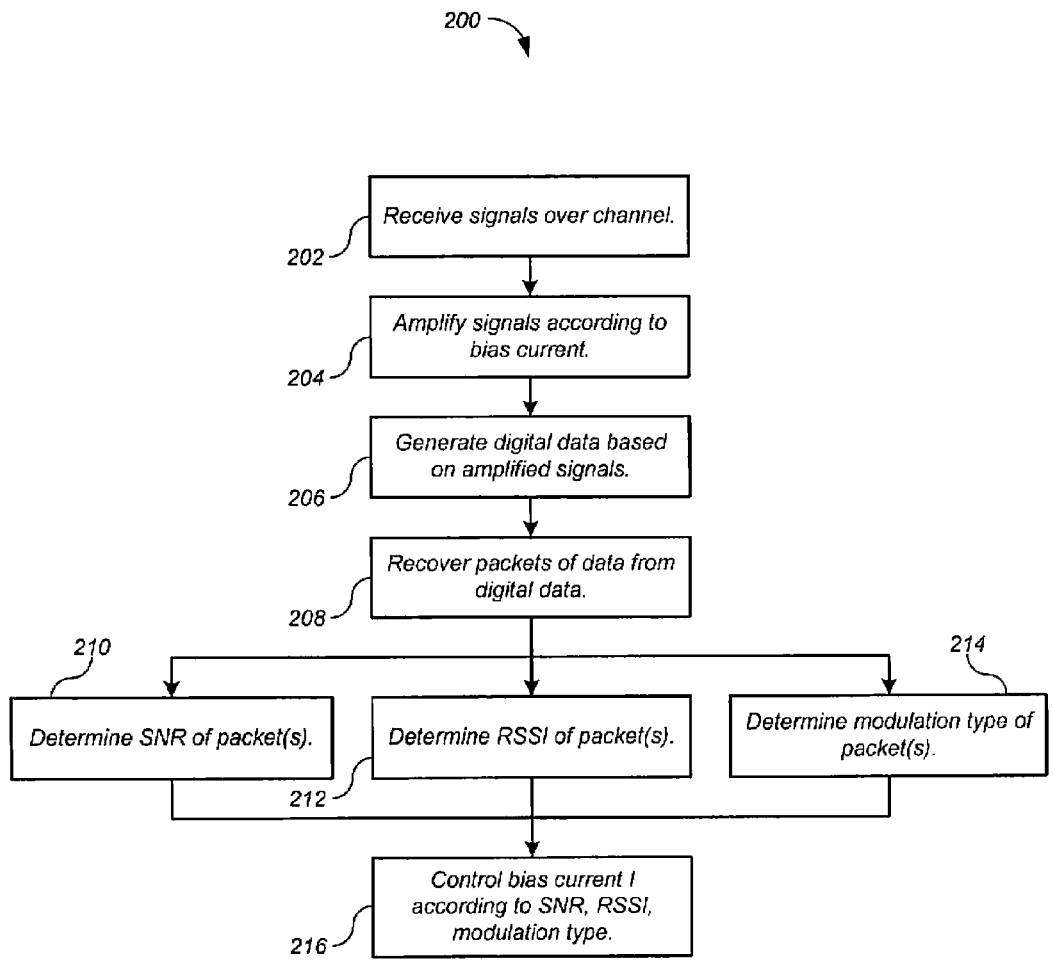
FIG. 2 shows a process for packet data communication device of FIG. 1 according to one embodiment.

FIG. 2 shows a process 200 for packet data communication device 102 of FIG. 1 according to one embodiment. Although in the described embodiments the elements of process 200 are presented in one arrangement, other embodiments may feature other arrangements. For example, in various embodiments, some or all of the steps of process 200 can be executed in a different order, concurrently, and the like.

Referring to FIG. 2, at 202 receiver 104 receives signals 114 over channel 106. At 204, amplifier 112 amplifies signals 114 according to bias current I. At 206, ADC 118 generates digital data 120 based on the amplified signals. At 208, packet module 122 recovers the packets of data from digital data 120. At 210, SNR module 126 determines an SNR of one or more of the packets. At 212, RSSI module 128 determines an RSSI of one or more of the packets. At 214, modulation type module 130 determines a modulation type of one or more of the packets. The SNR and RSSI are generally determined by processing the packets. In some embodiments, the SNR and RSSI are measured only during the preambles of the packets. In other embodiments, other portions of the packet are used instead or in addition to the preambles. The modulation type is generally determined by observing certain predetermined bits in the preambles of the packets. For example, in quadrature amplitude modulation (QAM) systems, the modulation type may be 16-QAM, 64-QAM, 128-QAM, 256-QAM, and the like. In some embodiments, all three packet characteristics are measured at 210, 212, and 214. In other embodiments, only one or two of the packet characteristics are measured.

At 216, control module 124 controls bias current I according to one or more characteristics of the packets of data. For example, control module 124 can control bias current I according to one or more factors such as the SNR, the RSSI, and the modulation type of the packets. To control bias current I, control module 124 asserts a control signal 132 (FIG. 1). Any technique can be used to determine the level of control signal 132, and therefore the level of bias current I. For example, the factors can be combined using a weighted calculation, can be used to populate a look-up table, and the like. Initial settings for these factors can be determined during calibration, provisioned during manufacture, or the like.

There are many ways to adjust bias current I. For example, as shown in FIG. 1, one way is to simply change the level of an adjustable current source 116. Another way is to implement amplifier 112 in multiple cascaded stages. Then bias current I can be changed by turning one or more of the stages on or off. Of course, other techniques can be used.

Figure 3:
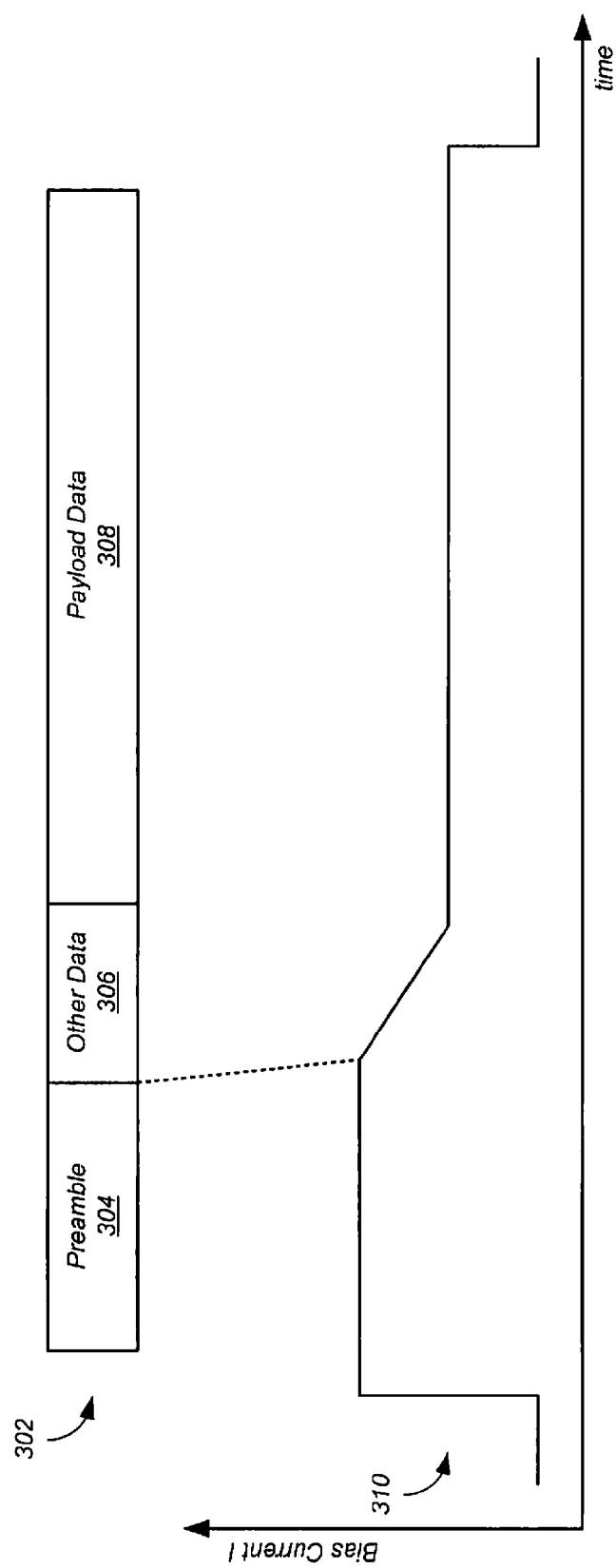
FIG. 3 shows a timing diagram for some embodiments.

In some embodiments, control module 124 controls bias current I for amplifying a payload of each packet based on the preamble of the packet. In this manner, bias current I can be adjusted on a per-packet basis. FIG. 3 shows a timing diagram for such embodiments. In FIG. 3, time flows from left to right. A packet 302 is shown. Packet 302 includes a preamble 304, which is followed by other data 306, which is followed by payload data 308. The level of bias current I is shown at 310. In the example of FIG. 3, the level of bias current I is unnecessarily high when packet 302 is received. Preamble 304 is observed to determine factors such as SNR, RSSI, modulation type, and the like. Based on these factors, the level of bias current I is reduced during reception of other data 306 so that bias current I is at a lower level during reception and amplification of payload data 308. Time is allowed for settling of analog transients prior to amplification of payload data 308. Reducing bias current I from an unnecessarily high level serves to conserve power in communication device 102.

In other cases the level of bias current I is too low. This is also determined during reception of preamble 304. The level of bias current I is then adjusted during reception of other data 306 so that bias current I is at a higher level during reception and amplification of payload data 308. Increasing bias current I from an insufficient level serves to reduce noise and bit error rate in communication device 102.

Various embodiments of the present disclosure can be implemented in digital electronic circuitry, or in computer hardware, firmware, software, or in combinations thereof. Embodiments of the present disclosure can be implemented in a computer program product tangibly embodied in a computer-readable storage device for execution by a programmable processor. The described processes can be performed by a programmable processor executing a program of instructions to perform functions by operating on input data and generating output. Embodiments of the present disclosure can be implemented in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, processors receive instructions and data from a read-only memory and/or a random access memory. Generally, a computer includes one or more mass storage devices for storing data files. Such devices include magnetic disks, such as internal hard disks and removable disks, magneto-optical disks; optical disks, and solid-state disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits).

A number of implementations have been described. Nevertheless, various modifications may be made without departing from the scope of the disclosure. Accordingly, other implementations are within the scope of the following claims.

What is claimed is:

1. An apparatus comprising:
an amplifier configured to amplify signals according to a bias current, wherein the signals represent packets of data, and wherein the amplifier includes a plurality of cascaded stages;
a packet module configured to recover the packets of data from the signals amplified by the amplifier; and
a control module configured to control the bias current by which the amplifier amplifies the signals, wherein the control module controls the bias current according to a signal-to-noise ratio (SNR), a received signal strength indication (RSSI), and a modulation type of each of the packets of data.

2. The apparatus of claim 1, further comprising:
an SNR module to determine the signal-to-noise ratio (SNR) of one or more of the packets;
an RSSI module to determine the received signal strength indication (RSSI) of one or more of the packets; and
a modulation type module to determine the modulation type of one or more of the packets.

3. The apparatus of claim 2:
wherein each of the packets includes a preamble; and
wherein the SNR, the RSSI, and the modulation type are determined based on the preambles of the one or more packets.

4. The apparatus of claim 3:
wherein the control module controls the bias current for amplifying a payload of each packet based on the preamble of the packet.

5. The apparatus of claim 1, further comprising:
a receiver to receive the signals.

6. A communication device comprising the apparatus of claim 5.

7. The communication device of claim 6, wherein the signals are wireless signals, and wherein the communication device is compliant with all or part of IEEE standard 802.11, including draft and approved amendments 802.11a, 802.11b, 802.11e, 802.11g, 802.11i, 802.11k, 802.11n, 802.11v, and 802.11w.

8. A method comprising:
amplifying, at an amplifier having a plurality of cascaded stages, signals according to a bias current supplied to the plurality of cascaded stages of the amplifier, wherein the signals represent packets of data;
recovering the packets of data from the signals as amplified by the amplifier; and
controlling the bias current supplied to the plurality of cascaded stages of the amplifier according to a signal-to-noise ratio (SNR), a received signal strength indication (RSSI), and a modulation type of each of the packets of data.

9. The method of claim 8, further comprising:
determining the signal-to-noise ratio (SNR) of one or more of the packets;
determining the received signal strength indication (RSSI) of one or more of the packets; and
determining the modulation type of one or more of the packets.

10. The method of claim 9:
wherein each of the packets includes a preamble; and
wherein the SNR, the RSSI, and the modulation type are determined based on the preambles of the one or more packets.

11. The method of claim 10:
wherein the bias current for amplifying a payload of each packet is controlled based on the preamble of the packet.

12. The method of claim 8, further comprising:
receiving the signals.

13. The method of claim 12, wherein the signals are wireless signals, and wherein the wireless signals are compliant with all or part of IEEE standard 802.11, including draft and approved amendments 802.11a, 802.11b, 802.11e, 802.11g, 802.11i, 802.11k, 802.11n, 802.11v, and 802.11w.

14. Non-transitory computer-readable media embodying instructions executable by a computer to perform a method comprising:
controlling a bias current supplied to a plurality of cascaded stages of an amplifier, the bias current being controlled according to a signal-to-noise ratio (SNR), a received signal strength indication (RSSI), and a modulation type of each of a plurality of packets of data,
wherein the packets of data are recovered from signals, amplified according to the bias current supplied to the plurality of cascaded stages of the amplifier.

15. The non-transitory computer-readable media of claim 14, wherein the method further comprises:
determining the signal-to-noise ratio (SNR) of one or more of the packets;
determining the received signal strength indication (RSSI) of one or more of the packets; and
determining the modulation type of one or more of the packets.

16. The non-transitory computer-readable media of claim 15:
wherein each of the packets includes a preamble; and
wherein the SNR, the RSSI, and the modulation type are determined based on the preambles of the one or more packets.

17. The non-transitory computer-readable media of claim 16:
wherein the bias current for amplifying a payload of each packet is controlled based on the preamble of the packet.

18. The non-transitory computer-readable media of claim 14, wherein the signals are wireless signals, and wherein the wireless signals are compliant with all or part of IEEE standard 802.11, including draft and approved amendments 802.11a, 802.11b, 802.11e, 802.11g, 802.11i, 802.11k, 802.11n, 802.11v, and 802.11w.

* * * * *